(12) United States Patent
Matsunaga et al.

(10) Patent No.: US 7,032,307 B2
(45) Date of Patent: Apr. 25, 2006

(54) METHOD FOR FABRICATING A PROBE PIN FOR TESTING ELECTRICAL CHARACTERISTICS OF AN APPARATUS

(75) Inventors: Noriaki Matsunaga, Chigasaki (JP); Hideki Shibata, Yokohama (JP); Nobuo Hayasaka, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 112 days.

(21) Appl. No.: 10/823,493

(22) Filed: Apr. 13, 2004

(65) Prior Publication Data

US 2004/0196058 A1    Oct. 7, 2004

Related U.S. Application Data

(62) Division of application No. 09/733,228, filed on Dec. 8, 2000, now Pat. No. 6,724,208.

(30) Foreign Application Priority Data

Dec. 21, 1999    (JP) ............... P11-363317

(51) Int. Cl.
*H05K 3/10* (2006.01)

(52) U.S. Cl. ............... 29/846; 29/842; 29/825; 439/93; 439/886; 324/761; 324/158.1

(58) Field of Classification Search ............ 29/846, 29/825, 842; 439/93, 886; 324/754, 757, 324/158.1, 761, 762, 72.5; 219/219; 174/267
See application file for complete search history.

(56) References Cited

U.S. PATENT DOCUMENTS

| | | | |
|---|---|---|---|
| 4,520,314 A | 5/1985 | Asch et al. ............... 324/158.1 |
| 5,381,101 A | 1/1995 | Bloom et al. ............... 324/676 |
| 5,677,978 A | 10/1997 | Lewis et al. ............... 385/147 |
| 5,725,995 A | 3/1998 | Leedy ............... 250/492.3 |
| 5,844,251 A | 12/1998 | MacDonald et al. ............ 257/10 |
| 5,847,569 A | 12/1998 | Ho et al. ............... 324/752 |
| 5,866,805 A | 2/1999 | Han et al. ............... 73/105 |
| 5,900,738 A | 5/1999 | Khandros et al. ............ 324/761 |
| 5,903,161 A | 5/1999 | Amemiya et al. ........... 324/754 |
| 5,929,649 A | 7/1999 | Cramer ............... 324/761 |
| 5,990,449 A | 11/1999 | Sugiyama et al. ........... 219/219 |
| 6,163,162 A | 12/2000 | Thiessen et al. ............ 324/761 |
| 6,175,242 B1 | 1/2001 | Akram et al. ............... 324/757 |
| 6,297,655 B1 | 10/2001 | Akram | |
| 6,307,161 B1 | 10/2001 | Grube et al. ............... 174/260 |
| 6,329,827 B1 | 12/2001 | Beaman et al. ............ 324/754 |
| 6,484,395 B1 * | 11/2002 | Marcus et al. ............... 29/842 |
| 6,518,518 B1 * | 2/2003 | Saiki et al. ............... 174/267 |

(Continued)

FOREIGN PATENT DOCUMENTS

JP    5198636    8/1993

(Continued)

*Primary Examiner*—Richard Chang
(74) *Attorney, Agent, or Firm*—Pillsbury Winthrop Shaw Pittman LLP

(57) ABSTRACT

A probe pin for testing electric characteristics of a semiconductor device comprises a silicon pin core (3, 23, 33), and a conductive film (4, 24, 34) covering the entire surface, including the bottom face, of the pin core. The bottom face of the probe pin is connected directly to an electrode (7, 37) positioned in or on a print wiring board. A number of probe pins can be connected to the associated electrodes at a high density, thereby forming a fine-pitch probe card having a superior high-frequency signal characteristic.

15 Claims, 7 Drawing Sheets

U.S. PATENT DOCUMENTS

| | | | |
|---|---|---|---|
| 6,640,432 B1 * | 11/2003 | Mathieu et al. | 29/842 |
| 6,669,489 B1 * | 12/2003 | Dozier et al. | 439/71 |
| 6,757,972 B1 * | 7/2004 | Farnworth | 29/884 |
| 6,792,679 B1 * | 9/2004 | Tai et al. | 29/877 |
| 6,920,689 B1 * | 7/2005 | Khandros et al. | 29/860 |
| 6,955,988 B1 * | 10/2005 | Nevin et al. | 438/700 |

FOREIGN PATENT DOCUMENTS

| | | |
|---|---|---|
| JP | 07-33597 | 2/1995 |
| JP | 09-203749 | 8/1997 |
| JP | 10-19934 | 1/1998 |
| JP | 10-132895 | 5/1998 |

* cited by examiner

METHOD FOR FABRICATING A PROBE PIN FOR TESTING ELECTRICAL CHARACTERISTICS OF AN APPARATUS

RELATED APPLICATIONS

This application is a divisional application of U.S. patent application Ser. No. 09/733,228, filed Dec. 8, 2000, now U.S. Pat. No. 6,724,208.

The present patent application claims the benefit of earlier Japanese Patent Application No. 11-363317 filed Dec. 21, 1999, the disclosure of which is entirely incorporated herein by reference.

BACKGROUND OF THE INVENTION

1. Field of the Invention

The present invention relates to a probe pin for testing electric characteristics of an apparatus, such as a semiconductor integrated circuit, an LCD, a magnetic recording device, or the like, and to a method for fabricating the probe pin. The invention also relates to a probe card using a set of probe pins.

2. Description of the Related Art

A test probe or a probe card is generally used to test the electric characteristics of a semiconductor integrated circuit printed on a wafer before the wafer is cut into chips. As the pattern of a semiconductor integrated circuit becomes fine and dense, the pitch of the probe pins have to be reduced. A fine-pitch probe can be fabricated by, for example, forming a silicon single crystal pin by a VLS (vapor liquid solid) technique (R. S. Wangner and W. C. Ellis, Appl. Phys. Lett. 4, 1996 at 89). In this technique, a metal, for example, gold (Au) is placed on a substrate, and this metal is heated in the gas phase containing the composition of the probe (that is, silicon). Then, silicon is deposited in the solid phase via the molten metal in the alloy liquid phase. This method allows a silicon single crystal probe to be formed easily and accurately at a fine pitch making use of crystal growth. Because a single crystal silicon probe has a high electric resistance, the silicon probe is generally coated with a low resistance metal, such as gold.

FIG. 1 illustrates a conventional silicon probe 100. The silicon probe 100 has pin core 102a rising in the vertical direction, a silicon wiring layer 102b extending in the horizontal direction, a nickel-phosphorus seed layer 103, and a gold (Au) plating layer 104 covering the seed layer 103. The vertical pin core 102a, the seed layer 103, and the plating layer 104 form an individual test pin 105. On the other hand, the horizontal wising layer 102b, the seed layer 103, and the plating layer 104, form a lead electrode 106 for extracting an electrode from the test probe 105. The test pin 105 is connected to an external circuit (for example, a tester) via the lead electrode 106.

To fabricate the conventional test probe shown in FIG. 1, a wiring pattern corresponding to the lead electrode 106 must be formed prior to forming the single crystal silicon pin rising in the vertical direction. The wiring pattern can be formed by, for example, forming a silicon layer on a sapphire substrate 101, coating the sapphire substrate with a photoresist, patterning the photoresist into a horizontal wiring pattern, and etching the silicon layer into the lead using the photoresist as a mask.

However, the conventional silicon probe requires a certain space around each pin in order to extract and arrange the lead on the substrate. In addition, each lead extending from the associated pin must be arranged at a certain distance from the other leads, so that signals propagating through adjacent leads will not interfere each other. These factors greatly limit the freedom of producing two-dimensional layout of a probe, especially with respects to the positions and the density of the probe pins. This limitation is a fatal obstacle to producing a fine-pitch probe for testing a highly dense circuit.

Another problem in the conventional probe set is that if the leads from the associated probes are arranged in the two-dimensional manner, the wiring length becomes inevitably long, and in addition, the lengths of the leads extending from different probes differ from one another. Consequently, variation occurs in signal transfer among different leads when measuring electric characteristics at a high frequency. The long lead causes the contact resistance to increase between the probe pin and the electrode formed on the substrate, which results in a measurement error.

SUMMARY OF THE INVENTION

Therefore, it is an object of the invention to overcome the problems in the prior art technique, and to provide a probe pin for testing electric characteristics of an apparatus, such as a highly integrated semiconductor circuit.

It is another object of the invention to provide a probe assembly, which is a combination of a probe pin and an electrode connected to the base of the test probe. This probe assembly allows the pitch of probe pins to be reduced when a number of pins are arranged on a board, and the lengths of the leads from the probes can be made almost equal. The probe assembly has a low contact-resistance, and is suitable to measurement at a high frequency.

It is still another object of the invention to provide a probe card with a superior high-frequency characteristic, which is brought into contact with a high-dense semiconductor wafer to collectively test electric characteristics of the integrated circuits formed on the wafer.

It is still another object of the invention to provide a method for fabricating a probe pin for testing electric characteristics of, for example, a semiconductor circuit, and having a superior high-frequency characteristic.

To achieve the objects, a probe pin for testing electric characteristics of an apparatus comprises a silicon pin core, and a conductive layer covering the entire surface of the silicon pin core. In this text, "covering the entire surface" means that not only the tip or the side face of the silicon pin, which is brought into direct contact with an integrated circuit to be tested, but also the bottom face of the silicon pin core is coated with the conductive layer. By coating the bottom face of the silicon pin, the bottom face of the silicon pin is connected directly to the electrode placed in the print wiring board, which is further connected to a tester. The direct connection between the bottom face of the silicon pin and the electrode eliminates the necessity of leads extending from the side face of the associated silicon pins in a two-dimensional plane. Consequently, the density of the silicon pins is greatly increased when multiple pins are arranged on a wiring board.

The probe pin can be used to test or evaluate various electric characteristics of an apparatus, such as a semiconductor device, a liquid crystal display (LCD), a magnetic recording device, and so on. For example, electric characteristics of a semiconductor device include, but not limited to logical characteristic of a logic circuit, voltage-current characteristic, threshold voltage of MOSFET, driving current, gate leak current, hot carrier resistivity, short fault or breaking fault of interconnections, wiring resistance, and capacitance.

The silicon pin may have a metal silicide layer on the bottom face. The metal silicide facilitates plating a conductive layer on the bottom face of the silicon pin. The metal silicide has an alloy-forming temperature below an alloy-forming temperature of silicon and the conductive layer. Such a metal silicide includes, but is not limited to nickel silicide ($Ni_2Si$), platinum silicide (PtSi, $Pt_2Si$), and lead silicide ($Pb_2Si$).

In another aspect of the invention, a probe assembly, which comprises a probe pin and an electrode positioned directly below and connected to the bottom of the probe pin, is provided. The probe pin comprises a silicon pin core and a conductive layer covering the entire surface of the silicon pin core. The significant feature of the probe assembly is that no leads or extracted electrodes are required.

The silicon pin core may have a metal silicide at its bottom. In this case, the metal silicide has an alloy-forming temperature below an alloy-forming temperature of the conductive layer and silicon. The electrode is connected to the bottom of the probe pin by soldering, or using a bonding agent or a resin.

In still another aspect of the invention, a probe card is provided. The probe card comprises one or more probe pins and a print wiring board having one or more electrode, each electrode being positioned below an associated probe pin, and connected to the bottom of the associated probe pin. Each probe pin comprises a silicon pin core and a conductive layer covering the entire surface of the silicon pin core. Because each probe pin is connected directly to the electrode at its bottom without requiring leads, the probe card has a fine-pitch and high-dense structure. This probe card can also eliminates variation in signal transfer due to differences in the lengths of the leads extracted from the associated pins. Accordingly, the probe card can measure a high-frequency signal in a stable manner. Since the lead or the extracted electrode, which was required in the conventional test probe, is eliminated, the contact resistance is greatly reduced, and highly precise measurement can be realized.

The prove card has an insulating layer filled in a space between the probe pins in such a manner that the tips of the probe pins project from the top surface of the insulating layer. The insulating layer makes the probe pins electrically independent from one another, and reinforces the probe card mechanically.

In still another aspect of the invention, a method for fabricating a probe pin is provided. With this method, one or more silicon pins are formed in the vertical direction by crystal growth. Then, the tip and the side face of each silicon pin are coated with a first metal. The tip and the side face of the silicon pin are collectively referred to as the first surface. Then, an insulating layer is formed around the silicon pins to mechanically fix the silicon pins. The insulating layer is formed by, for example, filling up the space between the silicon pins with an arbitrary insulating material in such a manner that the tips of the silicon pins project from the top surface of the insulating layer. Then, a second metal layer is formed on the bottom face of the insulating layer and the bottoms of the silicon pins. The bottom of the silicon pin is referred to as the second face. Then, the bulk is heated at a temperature higher than an alloy-forming temperature of silicon and the second metal and lower than an alloy-forming temperature of silicon and the fist metal. After the heating step, non-reacted second metal is removed by, for example, selective etching. Finally, a third metal is deposited on the selectively etched surface.

The first metal is, for example, gold (Au). The second metal is, for example, nickel (Ni), lead (Pb), and platinum (Pt). The third metal is the same as the first metal, or alternatively, other high-conductive metals may be used. The first and second metals are selected so that the alloy-forming temperature of silicon and the first metal is higher than the alloy-forming temperature of silicon and the second metal. With this method, the bottom face of the silicon pin core is covered with a high-conductive metal, and therefore, the probe pin can be connected directly to an electrode placed in a wiring board.

An alternative method may be used to fabricate a probe pin for testing the electric characteristics of an apparatus. In the alternative method, one ore more silicon pins are formed in the vertical direction by, for example, crystal growth. Then, the first face of each silicon pin, that is, the tip and the side face of the silicon pin, is coated with a first metal. Then, an insulating layer is formed around the silicon pins to mechanically fix the silicon pins by filling up the space between the silicon pins with an arbitrary insulating material. Then, a recess is formed at the bottom (that is, the second face) of each silicon pin by, for example, etching. Finally, a third metal layer is formed so as to cover the bottom face of the insulating layer and the recesses of the silicon pins.

The third metal is then removed from the bottom face of the insulating layer, while leaving the third metal inside the recesses. The bottoms of the silicon pins covered with the third metal are connected to electrodes arranged in a print board by one-to-one correspondence.

With this alternative method, the bottom of the silicon pin is covered directly with a conductive layer without forming a metal silicide film on the bottom thereof. Accordingly, the bottom of the silicon pin coated with a conductive layer can be connected directly to an electrode.

BRIEF DESCRIPTION OF THE DRAWINGS

Other objects and advantages will be apparent from the following detailed description of the invention in conjunction with the attached drawings, in which:

FIGS. 4A and 4B illustrate a probe card using multiple probe pins according to the first embodiment of the invention, in which FIG. 4A shows an example of connecting the bottom face of each pin to the electrode by soldering, and FIG. 4B shows an example of connecting the bottom face of each pin to the electrode by an adhesive film;

DESCRIPTION OF THE PREFERRED EMBODIMENTS (First Embodiment)

Figure 1:
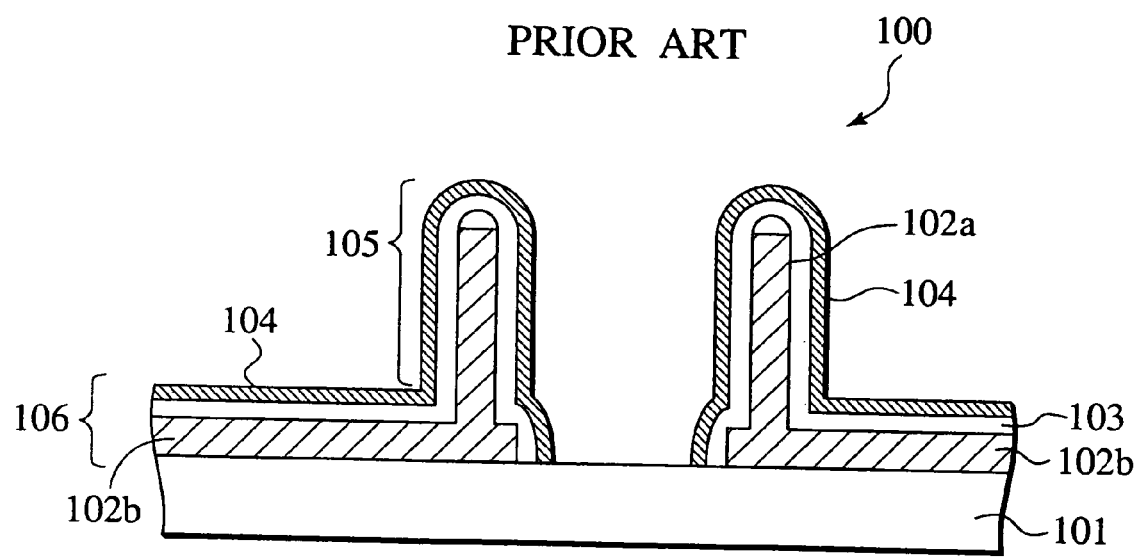
FIG. 1 illustrates a conventional silicon probe pin for testing electric characteristics of an apparatus.
Figure 2:
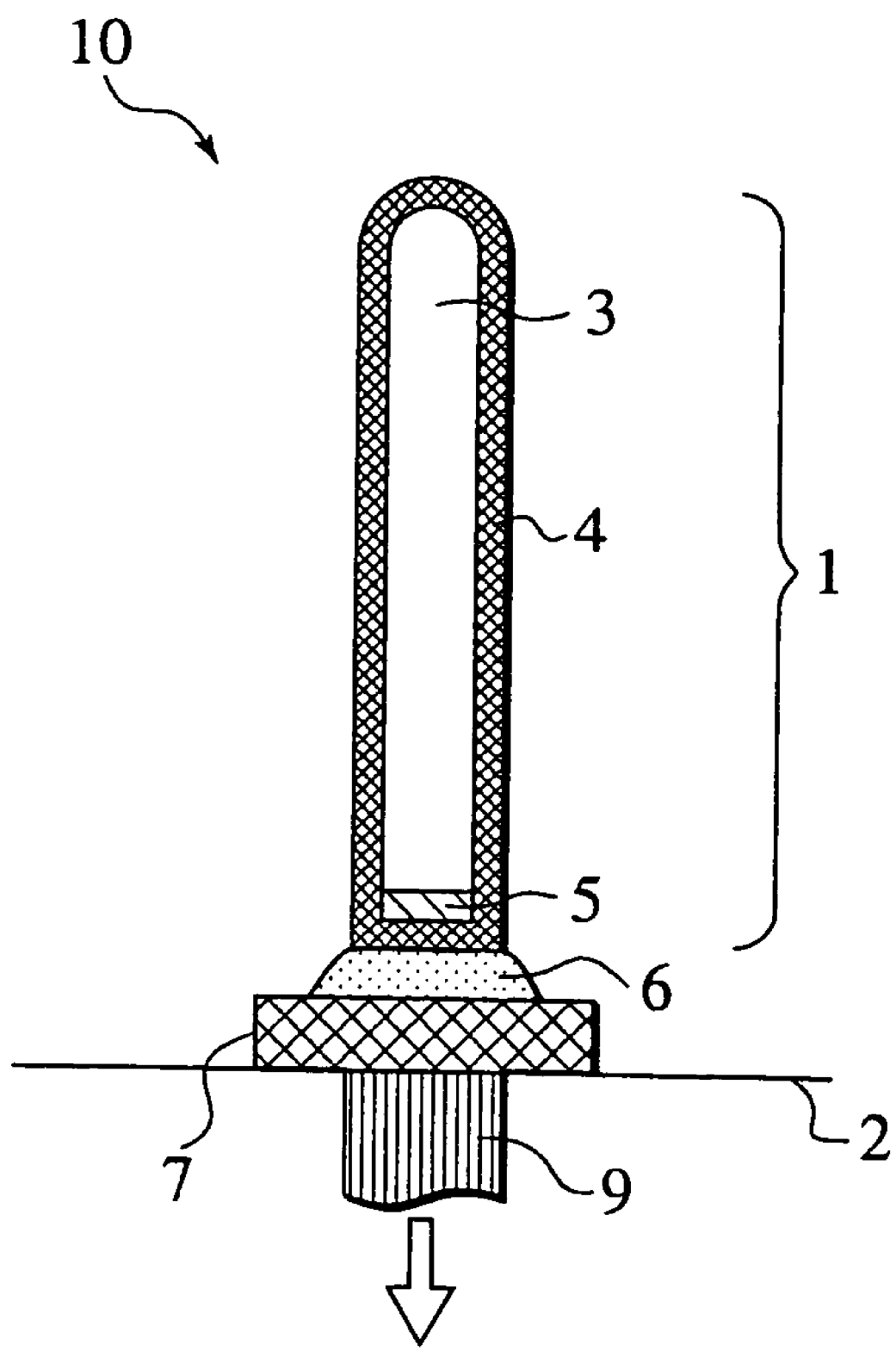
FIG. 2 illustrates a probe assembly according to the first embodiment of the invention, which includes a silicon probe pin for testing electric characteristics and an electrode connected directly to the silicon probe pin.

FIG. 2 illustrates a probe assembly 10 which includes a probe pin 1 for testing electric characteristics of, for example, a semiconductor device, and an electrode 7 connected directly to the bottom of the probe pin 1. The probe pin 1 comprises a single crystal silicon pin core 3, and a gold (Au) film 4 covering the entire surface of the silicon pin core 3. The probe pin 1 also has a nickel silicide ($Ni_2Si$) film 5 at the bottom of the silicon pin core 3. Because the resistance of silicon is comparatively high, the tip and the side face (collectively referred to as "the first surface") of a silicon pine, which are brought into contact with a semiconductor wafer during a test or measurement, were conventionally coated with a low-resistance metal film. The feature of the probe pin 1 is that the bottom (referred to as the "second surface") of the silicon pin core 3 is also coated with a low-resistance film, for example, a gold (Au) film 4.

The bottom (i.e., the second surface) of the silicon pin core 3 is connected directly to an electrode 7 using solder 6. The electrode 7 is fixed to a support board 2, and connected to an interconnection 9 formed in the support board 2. This arrangement can eliminate the lead electrode extending from the side of the silicon pin core in the horizontal direction, which was required in the conventional probe pin. The probe pin 1 and the electrode 7 connected directly to the bottom of the probe pin 1 constitute a probe assembly 10. By arranging a number of probe assemblies in a array on a print wiring board, a probe card having a pitch of about 10 µm is realized. Such a probe card is shown in FIG. 4, and the details of it will be described below.

The feature of the probe assembly 10 is that the horizontal lead extending from the side of the probe pin, which was the obstacle to reducing the pitch in the conventional probe card, is eliminated. Accordingly, the pitch between probe pins can be greatly narrowed. To be more precise, a conventional probe card generally has a pitch of 50 µm due to the horizontal leads creeping between the probe pins on the print board. In contrast, the probe card using the probe assemblies 10 of the present invention, the pitch can be reduced up to 10 µm by connecting the silicon probe pin 1 directly to the electrode 7. Such a fine pitch allows a reliable measurement of electric characteristics of a high-dense semiconductor integrated circuit.

The silicon probe pin 1 shown in FIG. 2 has a nickel silicide ($Ni_2Si$) film 5 at the bottom the silicon pin core 3. The nickel silicide film 5 allows the conductive film (e.g., a gold film) 4 to adhere to the bottom face of the silicon probe pin 1 in a reliable manner, thereby guaranteeing stable electrical connection. The bottom of the electrode 7 of the probe assembly 10 is connected to the interconnection 9 that extends inside the substrate 2. Accordingly, the probe pin 1 is electrically connected to an external circuit, such as a tester, via the electrode 7 and the interconnection 9.

FIG. 3 shows a process of fabricating the silicon probe pin 1 shown in FIG. 2.

Figure 3A:
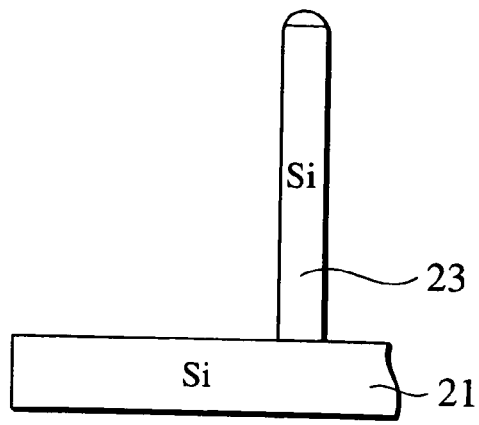
FIGS. 3A, 3B, 3C, 3D, 3E, 3F, 3G, and 3H illustrate a process of fabricating a probe pin shown in FIG. 2.
Figure 3B:
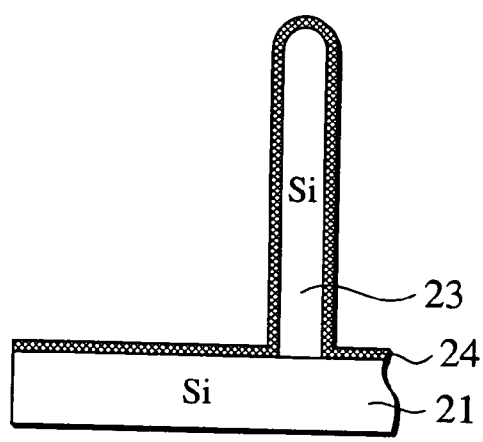

(a) First, a gold (Au) seed is placed by, for example, screen printing at a predetermined position on a silicon substrate 21. A single crystal silicon pin core 23 is grown in the vertical direction with respect to a silicon substrate 21 by a VLS technique, as shown in FIG. 3A. The precursor gas is, for example, silicontetrachloride ($SiCl_4$), dichlorsilane ($SiH_2Cl_2$), monosilane ($SiH_4$), or disilane($Si_2H_6$). Although a single silicon sin core 23 is illustrated in FIG. 2A, multiple pin cores 23 may be grown simultaneously at a predetermined interval. In this case, a gold (Au) seed pattern is formed by screen printing, or alternatively, a gold pattern may be formed by photolithography if a fine pitch of about 10 µm is required. With photolithography, a gold film and a photoresist are formed on the silicon substrate 21 in this order, and the photoresist is first patterned by photolithography to form a mask. Then, the gold film is etched into the predetermined seed pattern using the photoresist pattern as a mask. The height of the silicon pin core 23 is about 50 µm to 500 µm. The gold seed used for crystal growth remains on the top of the silicon pin core 23. This gold seed is incorporated in a gold coating film formed in the subsequent step.

(b) Then, the first face (i.e., the tip and the side) of the silicon pin core 23 and the top face of the silicon substrate 21 are coated with a first metal (gold in this example) 24, as shown in FIG. 2B. The gold film 24 is formed by sputtering, or by combination of sputtering and electrolytic plating. The thickness of the gold film 24 is about 1 µm for a 10 µm-pitch probe pin, and is more for a probe pin with a greater pitch in order to increase the conductivity.

Figure 3C:
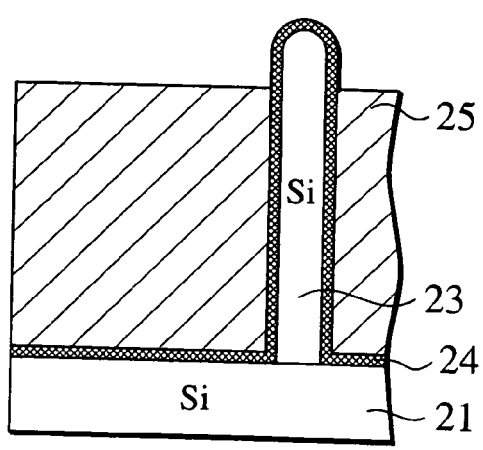

(c) Then, an insulating layer 25 is formed by filling the space between the coated silicon pin cores 23 with polyimide, as shown in FIG. 3C. The tip of the silicon pin sticks out from the top face of the polyimide insulating layer 25 for direct contact with an integrated circuit formed on a wafer during a test or a measurement. The polyimide insulating layer 25 can also functions as an reinforcement for fixing the silicon pin and increasing the mechanical strength.

Figure 3D:
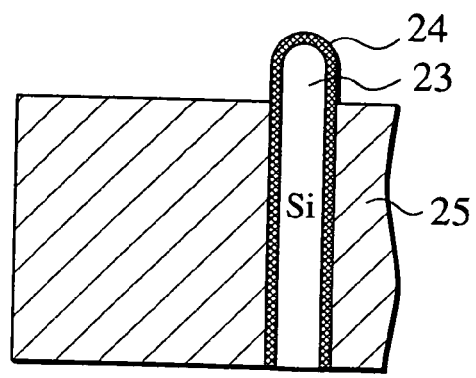

(d) Then, the silicon substrate 21 is removed, as shown in FIG. 3D, by polishing the substrate 21 up to a certain thickness, and then, by wet etching using an etchant that can etch silicon without etching the gold film 24. The etchant is, for example, a mixture of hydrofluoric acid (HF) and nitric acid ($HNO_3$). The gold film 24 remaining on the bottom of the insulating layer 25 is also removed by, for example, CMP, whereby the second face (i.e., the bottom face) of the silicon pin core 23 and the bottom of the insulating layer 25 are exposed.

(e) Then, a nickel (Ni) film 26 is formed on the second face of the silicon pin core 23 and the bottom face of the insulating layer 25 up to the thickness of several microns. The nickel film 26 is formed by, for example, sputtering or nickel paste coating. Nickel is an example of the second metal for forming a metal silicide at the bottom of the silicon pin core 23.

Figure 3E:
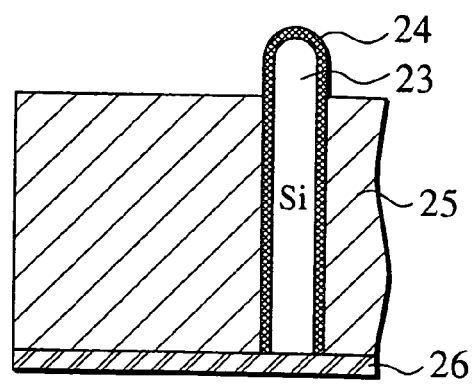
Figure 3F:
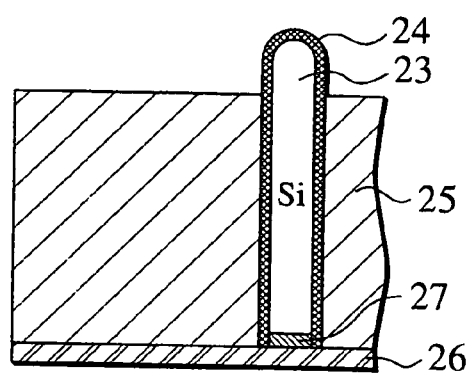

(f) After the formation of the nickel film 26, the bulk is heated at a temperature ranging from 200° C. to 350° C. Silicon and nickel react thermally with each other in this temperature range, and alloy into a silicide. As a result, a nickel silicide ($Ni_2Si$) film 27 is formed at the bottom of the silicon pin core 23, as shown in FIG. 3F. In the above-mentioned temperature range, silicon and gold do not show any reactions, and therefore, the gold film 24 remains as it is.

Figure 3G:
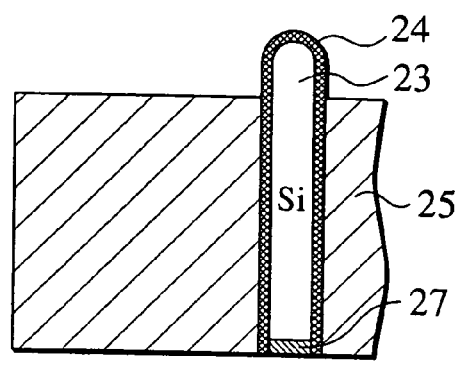

(g) Then, non-reacted nickel film 26 is removed, as shown in FIG. 3G by using a solution that dissolves nickel, but does not dissolve nickel silicide. Such a solution is, for example, a mixture of hydrogen peroxide and sulfuric acid ($H_2SO_4+H_2O_2$), which can remove only nickel in a selective manner.

Figure 3H:
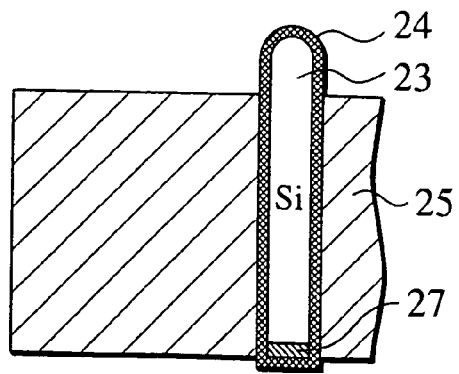

(h) Finally, the second face (i.e., the bottom face) of the silicon pin core 23 is coated with a third metal (gold in this example) by, for example, electrolytic plating, as shown in FIG. 3H. In this manner, the entire surface of the silicon pin core 23 is coated with a conductive film 24.

The nickel silicide 27 formed at the bottom of the silicon pin core 23 allows the gold film to attach to the bottom face of the silicon pin core 23 in a reliable manner. The gold film must be formed selectively on the bottom face of the silicon pin core 23 without covering the bottom face of the polyimide insulating layer 25. For this reason, electrolytic plating is a suitable method for the selective film formation, instead of sputtering. However, electrolytic plating has a problem that it is difficult for gold to adhere to silicon surface, unlike sputtering. To overcome this problem, a nickel silicide film 27 is formed at the bottom of the silicon pin core 23 in advance to enhance the adhesion of gold during the electrolytic plating.

Although, in the first embodiment, nickel is used as the second metal for producing a metal silicide in step (e) shown in FIG. 3E, other metals may be used as long as it reacts with silicon at a temperature below the alloy-forming temperature (about 400° C.) of silicon and gold. For example, lead (Pb) or platinum (Pt) may be sputtered onto the bottom face of the insulating layer, and heated at the corresponding alloy-forming temperature. In this case, a metal silicide, such as PtSi, $Pt_2Si$, or $Pb_2Si$, is formed at the bottom of the silicon pin core 23.

Although, in step (h) shown in FIG. 3H, gold (Au) is used as the third metal to cover the bottom face of the silicon pin core 23, other low-resistance metal, such as silver, may be used.

FIG. 4 illustrates a probe card having multiple probe pins for testing electric characteristics of, for example, a semiconductor integrated circuit. Each probe pin is connected to one of the electrodes arranged on a print wiring board 120. A probe pin and the associated electrode constitute a probe assembly.

Figure 4A:
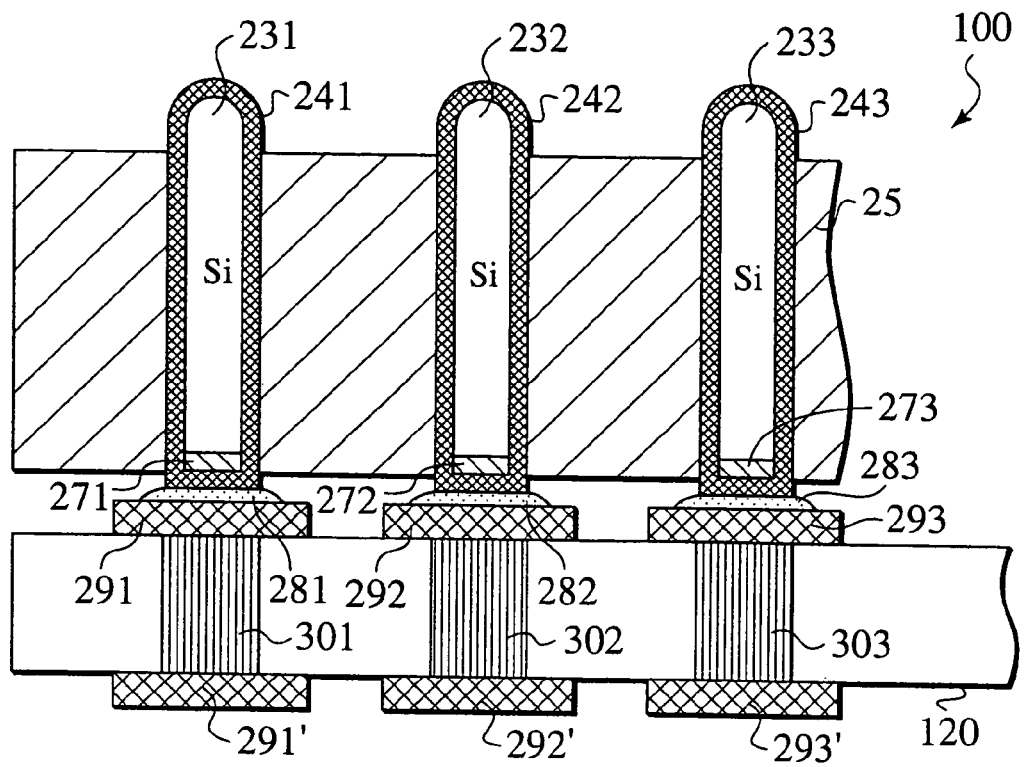

In FIG. 4A, a probe card 100 has multiple silicon probe pins, each comprising a silicon pin core (231, 232, 233) and a conductive film (241, 242, 243) covering the entire surface of the silicon pin core. The probe card 100 also has a pint wiring board 120, on which multiple electrodes (291, 292, 293) are arranged. The second face (i.e., the bottom face) of each probe pin is connected directly to the associated electrode (291, 292, 293) using a solder ball (281, 282, 283). Counterpart electrodes 291', 292', 293' are furnished to the bottom face of the print wiring board 120 at positions corresponding to the electrodes 291, 292, 293 placed on the top face of the print wiring board 120. Each pair of electrodes are connected to each other by, for example, a copper (Cu) wire (301, 302, 303). Preferably, the polyimide insulating layer 25 formed in step of FIG. 3C is left as it is without removing in order to maintain the mechanical strength of the probe card 100.

Before the second faces (i.e., the bottom faces) of the probe pins held by the polyimide insulating layer 25 are connected to the associated electrodes 291, 292, 293, semisolid solder is pressured via a mesh to put solder balls 281, 282, 283 on the respective electrodes 291, 292, 293. Then, the bottoms of the probe pins covered with a gold film are brought directly above the associated solder balls by, for example, an X-Y positioning apparatus, and pressed against the solder balls.

Figure 4B:
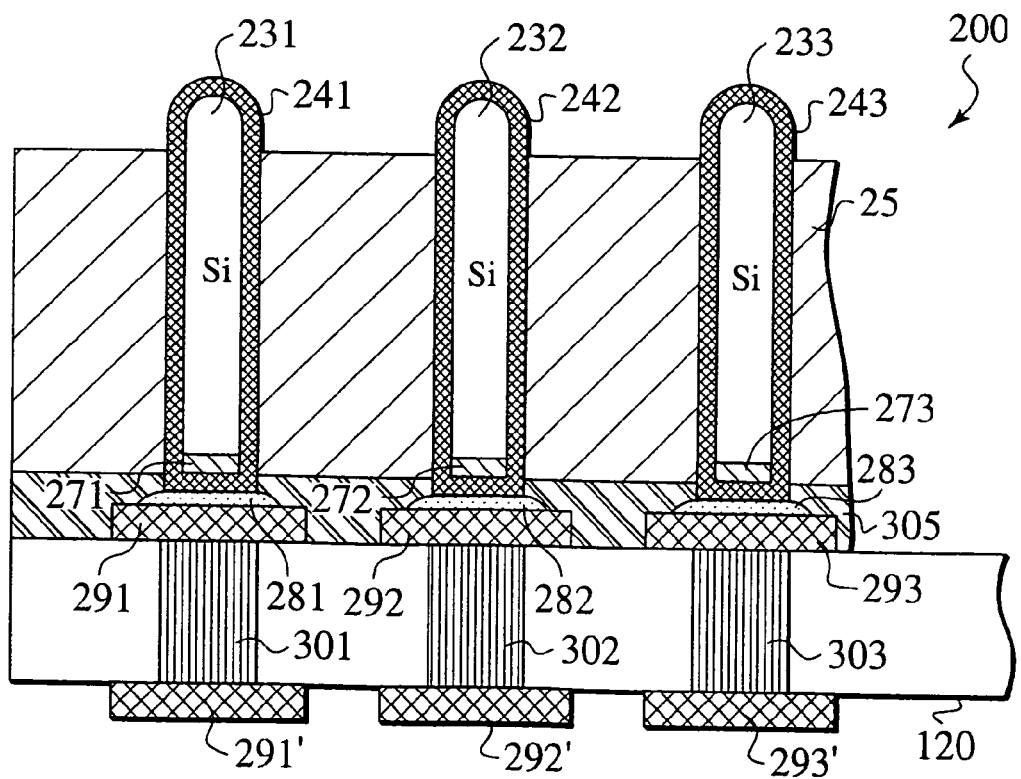

FIG. 4B illustrates probe card 200, which is another example of the application of the probe pin of the present invention. The second face (i.e., the bottom faces) of the probe pins are connected to the electrodes 291–293 by an adhesive layer 305 in place of, or together with solder balls 281, 282, 283. The adhesive layer 305 may be a bonding agent or a thermoplastic resin used in a semisolid state. In either case, a bonding agent or a semisolid resin is applied on the print board 120 using, for example, a squeegee so as not to hide the electrodes 291, 292, 293. The bonding agent or the semisolid resin is swelled up on the print board 120. Then, the second faces (i.e., the bottom faces) of the probe pins are positioned directly above the electrodes, and brought into contact with the electrodes. At this time, the bottom face of the insulating layer 25 is pressed against the swelling bonding agent or resin. As a result, the bonding agent is flattened in the horizontal direction, an even adhesive layer 305 is formed between the polyimide insulating layer 25 and the print wiring board 120. The adhesive 305 hardens as time passes, and the polyimide insulating layer 25 is fixed to the print wiring board 120. This arrangement guarantees electric connection between the probe pins and the electrodes are filled with the adhesive layer 305 to seal up the mechanical connection between the probe pin and the electrodes.

(Second Embodiment)

Figure 5:
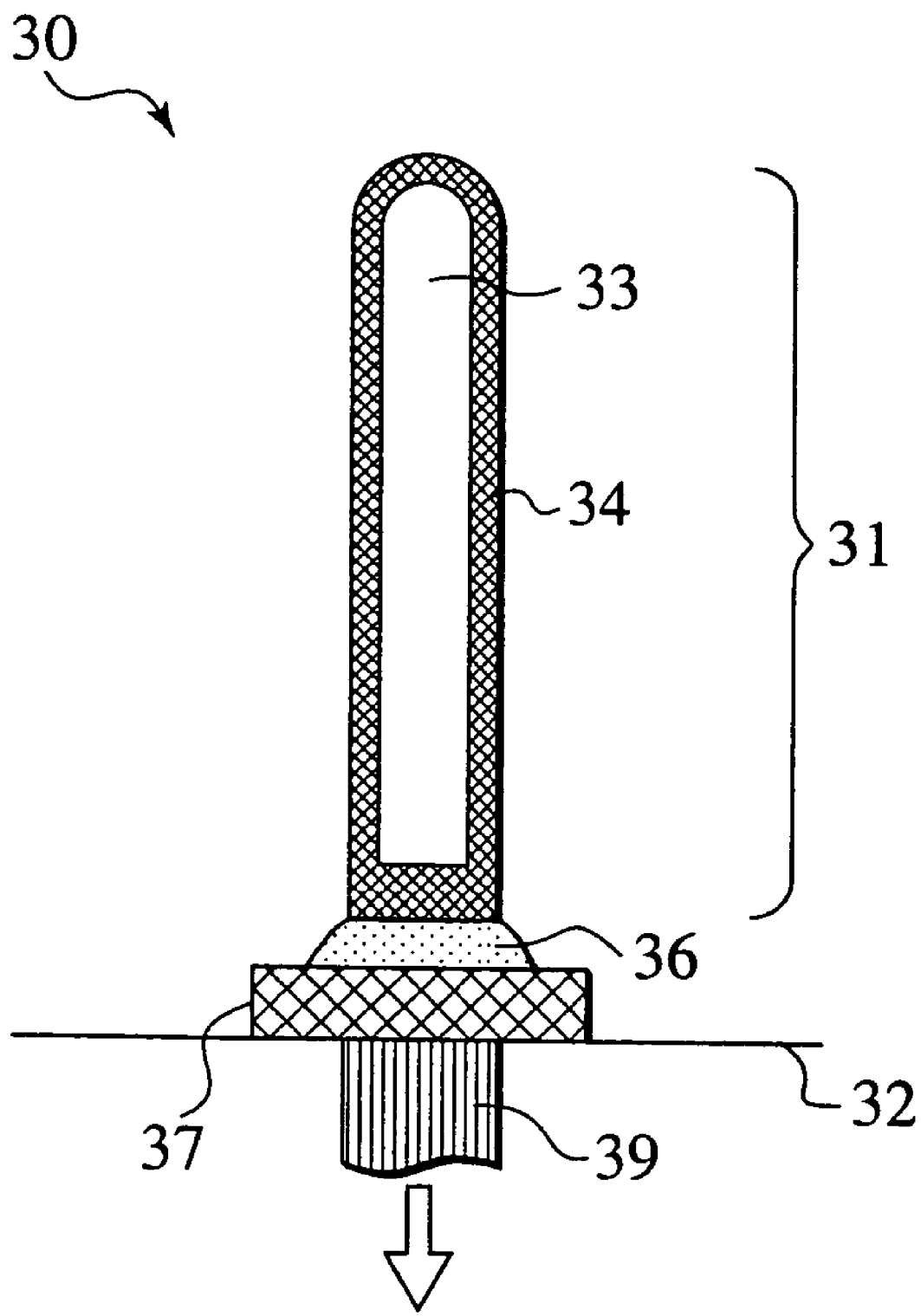
FIG. 5 illustrates a probe pin for testing electric characteristics according to the second embodiment of the invention.

FIG. 5 illustrates a probe assembly 30 that includes a probe pin 31 for testing electric characteristics of, for example, a semiconductor integrated circuit, and an electrode 37 connected directly to the bottom of the probe pin by soldering. The probe pin 31 comprises a single crystal silicon pin core 33 and a gold film 34 covering the entire surface of the silicon pin core 33. Unlike the probe pin 1 of the first embodiment, the probe pin 31 does not have a nickel silicide ($Ni_2Si$) film at the bottom. Accordingly, the second face (i.e., the bottom face) of the silicon pin core is directly coated with the gold film 34. The bottom of the electrode 37 is connected to the interconnection 39 extending inside the substrate 32, as in the first embodiment explained in conjunction with FIG. 2. The probe pin 31 is electrically connected to an external circuit via the electrode 37 and the interconnection 39.

FIG. 6 illustrates a process of fabricating the probe pin 31 shown in FIG. 5. The steps from crystal growth to formation of polyimide insulating layer (FIGS. 3A through 3C) are in common with the first embodiment. Accordingly, FIG. 6 illustrates the steps following the step of FIG. 3C.

Figure 6A:
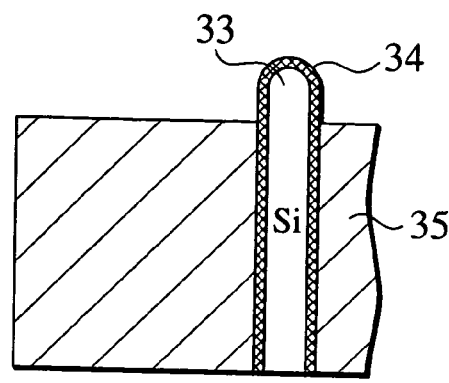
FIGS. 6A, 6B, 6C, and 6D illustrate a process of fabricating the probe pin shown in FIG. 5, the process continuing from the step 3C shown in FIG. 3.

First, the silicon substrate is removed from the polyimide insulating layer, as shown in FIG. 6A. As in the first embodiment, the silicon substrate can be removed by combination of polishing and wet etching. The gold film is also removed from the bottom face of the insulating layer by CMP.

Figure 6B:
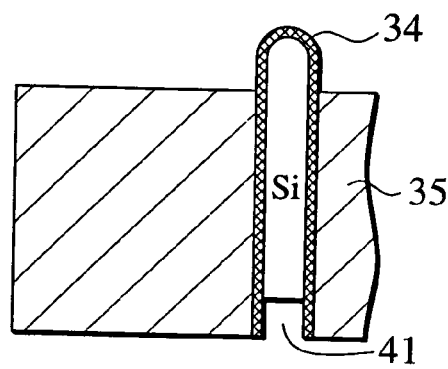
Figure 6C:
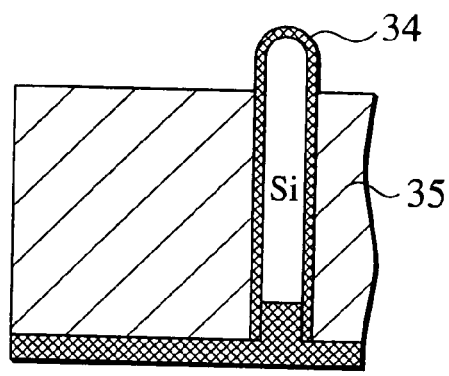

Then, a recess 41 is formed by selectively etching only the bottom portion of the silicon pin core 33, as shown in FIG. 6B. The etchant used in this step dissolves only silicon, and does not dissolve polyimide or gold (i.e., the first metal). An example of the exchange is a mixture of hydrofluoric acid (HF) and nitric acid ($HNO_3$). Acetic acid ($CH_3COOH$) may be added to adjust the etching speed. Preferably, the depth of the recess 41 is greater than the thickness of the gold film 34 formed on the first face of the silicon pin core 33 in order to sufficiently reduce the resistance of the silicon probe pin 31 at the second face (i.e., the bottom face). For example, if the thickness of the gold film 34 is 1 micron, then the depth of the recess 41 ranges from 1 micron to 5 microns. If the thickness of the gold film 34 is increased, the depth of the recess 41 is also increased.

Then, a third metal, for example, gold is sputtered onto the recess 41 and the entire bottom face of the polyimide insulating layer 35 so as to form a conductive layer of about 10 micron thickness. Unlike the electrolytic plating used in the first embodiment for selectively forming a gold film only on the bottom face of the silicon pin core, gold is deposited onto the entire bottom face of the insulating layer by sputtering. As has been described above, sputtering allows gold to attach to silicon surface easily, as compared with electrolytic plating, and accordingly, the gold film 34 can be formed directly onto the single crystal silicon surface in this embodiment. In other words, the method shown in FIG. 6 does not require the step of forming a metal silicide at the bottom of the silicon pin core 33.

Figure 6D:
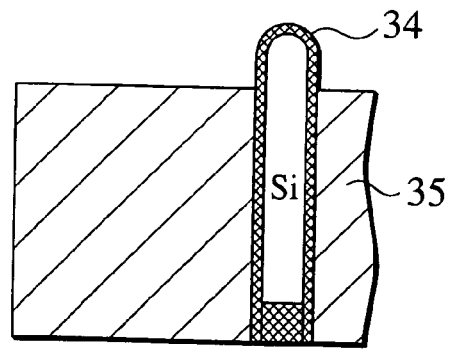

Finally, an excessive amount of gold film is removed from the bottom face of the insulating layer 35 by, for example, CPM, so that only the gold film filled in the recess 41 remains, as shown in FIG. 6D. The entire surface of the silicon pin core 33 is coated with the gold film 34.

As in the first embodiment, the insulating layer 35 is left in order to reinforce the mechanical strength of the probe pin.

Two or more silicon pin cores 33 may be grown in the vertical direction simultaneously. By connecting the bottom face of the probe pin, which is covered with the gold film 34, directly to the electrodes arranged in an array on a print wiring board, a fine-pitch probe card can be fabricated.

The present invention is not limited to the examples described above, and many other modifications and substitutions may be made without departing from the scope of the invention. For example, the probe pin can be applicable to, for example, an interposer, other than a probe card.

Although, in the preferred embodiments, the electrodes are arranged on the print wiring board, the electrodes may be buried in the print wiring board so that the top faces are exposed to receive the probe pins.

What is claimed is:

1. A method for fabricating probe pins, comprising:
   forming silicon pins rising in the vertical direction by crystal growth, each silicon pin having a tip, a side, and a bottom;
   coating the tip and the side of each silicon pin with a first metal forming an insulating layer filling up the space between the silicon pins to fix the silicon pins so that the tips of the silicon pins project from a top face of the insulating layer and that a bottom face of the insulating layer aligns with bottoms of the silicon pins;
   covering the bottom face of the insulating layer and the bottoms of the silicon pins with a second metal;
   heating the silicon pins, the insulating layer, and the first and second metals all together at a temperature above an alloy-forming temperature of silicon and the second metal and below an alloy-forming temperature of silicon and the first metal;
   removing a non-reacted second metal that has not been reacted with the silicon pins during the heating step; and
   forming a third metal on the bottoms of the silicon pins, from which the non-reacted second metal has been removed.

2. The method according to claim 1, wherein the silicon pins are formed on a silicon substrate, and the silicon substrate is removed after the insulating layer is formed.

3. The method according to claim 1, further including connecting the bottoms of the silicon pins covered with the third metal to electrodes placed in a print board by one-to-one correspondence.

4. The method according to claim 1, wherein the first metal is gold.

5. The method according to claim 1, wherein the second metal is nickel.

6. The method according to claim 1, wherein the second metal is platinum.

7. The method according to claim 1, wherein the second metal is lead.

8. The method according to claim 1, wherein forming the third metal on the bottoms of the silicon pins includes coating the bottoms with the third metal utilizing electrolytic plating.

9. A method for fabricating a probe pin, comprising:
   forming a silicon pin rising in the vertical direction by crystal growth, the silicon pin having a tip, a side, and a bottom;
   coating the tip and the side of the silicon pin with a first metal forming an insulating layer to fix the silicon pin so that the tip of the silicon pin projects from a top face of the insulating layer and that a bottom face of the insulating layer aligns with the bottom of the silicon pin;
   covering the bottom face of the insulating layer and the bottom of the silicon pin with a second metal;
   heating the silicon pin, the insulating layer, and the first and second metals all together at a temperature above an alloy-forming temperature of silicon and the second metal and below an alloy-forming temperature of silicon and the first metal;
   removing a non-reacted second metal that has not been reacted with the silicon pins during the heating of the silicon pin; and
   forming a third metal on the bottom of the silicon pin, from which the non-reacted second metal has been removed.

10. The method according to claim 9, wherein the silicon pin is formed on a silicon substrate, and the silicon substrate is removed after the insulating layer is formed.

11. The method according to claim 9, wherein the first metal is gold.

12. The method according to claim 9, wherein the second metal is nickel.

13. The method according to claim 9, wherein the second metal is platinum.

14. The method according to claim 9, wherein the second metal is lead.

15. The method according to claim 9, wherein forming the third metal on the bottom of the silicon pin includes coating the bottom with the third metal utilizing electrolytic plating.

\* \* \* \* \*